(12) United States Patent
Rajagopal et al.

(10) Patent No.: US 7,598,822 B2
(45) Date of Patent: Oct. 6, 2009

(54) PROCESS, SUPPLY, AND TEMPERATURE INSENSITIVE INTEGRATED TIME REFERENCE CIRCUIT

(75) Inventors: Narasimhan Trichy Rajagopal, Dallas, TX (US); Patrick Peter Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/100,783

(22) Filed: Apr. 7, 2005

(65) Prior Publication Data

US 2006/0226922 A1  Oct. 12, 2006

(51) Int. Cl.
*H03L 1/00*      (2006.01)
(52) U.S. Cl. .................. 331/176; 331/111; 331/143
(58) Field of Classification Search .................. 331/111, 331/113 R, 143, 144, 176
See application file for complete search history.

(56) References Cited

U.S. PATENT DOCUMENTS

| | | | |
|---|---|---|---|
| 5,180,995 A * | 1/1993 | Hayashi et al. | 331/57 |
| 6,091,286 A | 7/2000 | Blauschild | |
| 6,356,161 B1 * | 3/2002 | Nolan et al. | 331/176 |
| 6,496,056 B1 * | 12/2002 | Shoji | 327/543 |
| 6,917,249 B1 * | 7/2005 | Kuo et al. | 331/143 |

\* cited by examiner

*Primary Examiner*—Robert Pascal
*Assistant Examiner*—James E Goodley
(74) *Attorney, Agent, or Firm*—William B. Kempler; Wade J. Brady, III; Frederick J. Telecky, Jr.

(57) ABSTRACT

Precision integrated time reference circuits are disclosed. Preferred embodiments provide time reference circuits that are relatively insensitive to variations in process, supply, and temperature. A preferred embodiment of the invention is disclosed in which a relaxation oscillator according to the invention includes a reference voltage circuit configured to maintain a reference voltage in proportion to actual circuit resistance values. Aspects of the invention also include dynamic compensation for variations in temperature.

10 Claims, 5 Drawing Sheets

PROCESS, SUPPLY, AND TEMPERATURE INSENSITIVE INTEGRATED TIME REFERENCE CIRCUIT

TECHNICAL FIELD

The invention relates to microelectronic circuitry and methods for implementing the same. More particularly, the invention relates to integrated time reference circuitry for implementation in monolithic ICs providing improved performance and limited output variation due to variations inherent in electronic components and processes.

BACKGROUND OF THE INVENTION

Time reference circuits are often used in the arts where periodic waveforms or pulses are required. Many factors can affect the accuracy of such circuits such as inherent variations in resistance, capacitance, and other properties of the circuit components themselves. Variations in electrical properties to due changes in temperature can further complicate matters. For example, relaxation oscillators are one type of time reference circuits commonly used in monolithic IC designs. The basic mechanism is to charge or discharge a capacitor either through an R-C network or with a constant current source, thus producing a periodic waveform output. The output frequency is inversely proportional to the sum of the charging and the discharging times, and the duty cycle depends on the ratio of the charging to discharging time. Relaxation oscillators can be generally classified as R-C relaxation oscillators or constant-current relaxation oscillators. Simplified conceptual circuit schematic diagrams of examples of R-C and constant-current relaxation oscillators and their outputs are shown in FIG. 1A (prior art) through FIG. 2B.

Referring primarily to FIGS. 1A (prior art), and 1B, an example of an R-C relaxation oscillator circuit 10 is shown. The thresholds of the Schmitt trigger 12 are $V_a$ and $V_b$. The hysteresis of the Schmitt trigger 12 is $V_a$-$V_b$. With the switch S1 open, $v_{o1}$, rises exponentially toward $V_{cc}$. When it reaches $V_b$, it trips the Schmitt 12 and S1 closes, $v_{o1}$ then drops exponentially toward $V_L$. $V_L$ is as given by Equation 2. When $v_{o1}$ reaches $V_a$ the Schmitt trigger 12 changes state and switch S1 is opened once again, repeating the previous cycle. The frequency of the R-C relaxation oscillator circuit 10 output VOUT1 shown in FIG. 1B can also be described by Equations 1 thru 7.

$$tau1 = r1c1 \quad (eq\ 1)$$

$$VL = Vcc.r2/(r1+r2) \quad (eq\ 2)$$

$$tau2 = (r1 \| r2).c1 \quad (eq\ 3)$$

$$t1 = tau1.\ln(Vcc-Va/Vcc-Vb) \quad (eq\ 4)$$

$$t2 = tau2.\ln(Vb-VL/Va-VL) \quad (eq\ 5)$$

$$f = 1/T = 1/(t1+t2) \quad (eq\ 6)$$

$$1/f = r1c1.\{\ln(Vcc-Va/Vcc-Vb) + (r2/(r1+r2)).\ln(Vb-VL/Va-VL)\} \quad (eq\ 7)$$

Now referring primarily to FIGS. 2A (prior art) and 2B, an example of a constant-current relaxation oscillator circuit 20 is shown. It may be seen that the constant-current source oscillator 20 uses a current I2 instead of a resistor (R2 in FIG. 1A) to charge and discharge a timing capacitor C2. With I2 cut off, I1 charges C2 towards $V_{cc}$ until $v_{o2}$ equals $V_a$. Then the Schmitt trigger 22 output goes high and the current source I2 is turned on. Assuming I2>I1, I2−I1 now discharges the capacitor until $v_{o2}$ equals $V_b$. The Schmitt trigger 22 then changes state again and turns off I2 to repeat the cycle. FIG. 2B portrays an example of a waveform output from a constant-current oscillator such as in the circuit shown in FIG. 2A (prior art).

Commonly in monolithic designs, the only constant source available is a voltage $V_{BG}$ generated from a band-gap reference. The current $I_{BG}$ generated from a band-gap referenced voltage $V_{BG}$ using an on-chip resistor R makes the current $I_{BG}$ dependent on the variation of the resistor R. Equations 8 thru 13 describe the output frequency dependency of a constant-current source oscillator on the on-chip resistor R and capacitor C.

$$i1 = Vbg/r1 \quad (eq\ 8)$$

$$i2 = k.i1(k > 1) \quad (eq\ 9)$$

$$t1 = (Vb-Va)c1/i1 \quad (eq\ 10)$$

$$t2 = (Vb-Va).c1/(k-1)i1 \quad (eq\ 11)$$

$$f = 1/T = 1/(t1+t2) = i1.(k-1)/(k.c1.(Vb-Va)) \quad (eq\ 12)$$

$$f = Vbg.(k-1)/(k.r1.c1.(Vb-Va)) \quad (eq\ 13)$$

The frequency of a relaxation oscillator depends on the R-C product and also on the supply voltage if the threshold of the trigger is dependent on the supply voltage. Circuit techniques have been developed to make the trip points or Schmitt trigger thresholds supply-independent. One way known in the arts to make the trip points supply-independent is to use band-gap voltage as a reference for comparison to the voltage across the capacitor.

An example of the band-gap referenced approach is illustrated in FIG. 3 (prior art). The relaxation oscillator circuit 30 of FIG. 3 uses a band-gap referenced current $i_{BG}$. The current $i_{BG}$ is switched using two inverters INV1, INV2 to charge two capacitors C3, C4 alternately. The first capacitor C3 is charged to $V_{BG}$, after which it trips the first comparator COMP1. The current $i_{BG}$ is then switched to charge the second capacitor C4. The output of the oscillator VOUT3 is high while the first capacitor C3 is charged, and it then goes low when the first comparator COMP1 trips. When the voltage $V_4$ on the second capacitor C4 reaches $V_{BG}$, a second comparator COMP2 trips, and the current $i_{BG}$ is switched back to the first capacitor C3, and so on. Thus, a periodic waveform output VOUT3 is obtained with a 50% duty cycle. The output frequency depends on how much time the current $i_{BG}$ takes to charge the capacitors C3, C4 to $V_{BG}$. Note that $V_{BG}$ is independent of power supply. It is known to use external trim to correct the output frequency when for the effects of variation in temperature and process. Table 1 gives an example of representative frequency variation of this circuit 30 with two trim bits used to trim the frequency.

TABLE 1

| Supply V | TEMP | Trim = 01 NOMINAL Frequency (MHz) | Trim = 01 WEAK frequency (MHz) | Trim = 11 STRONG Frequency (MHz) |
|---|---|---|---|---|
| 1.65 | −40 | 5.89 | 4.66 | 5.81 |
| 1.65 | 27 | 5.39 | 4.20 | 5.36 |

TABLE 1-continued

| Supply V | TEMP | Trim = 01 NOMINAL Frequency (MHz) | Trim = 01 WEAK frequency (MHz) | Trim = 11 STRONG Frequency (MHz) |
|---|---|---|---|---|
| 1.65 | 150 | 5.12 | 3.98 | 5.19 |
| 1.80 | −40 | 5.78 | 4.52 | 5.72 |
| 1.80 | 27 | 5.34 | 4.16 | 5.32 |
| 1.80 | 150 | 5.11 | 3.97 | 5.17 |
| 1.95 | −40 | 5.70 | 4.45 | 5.66 |
| 1.95 | 27 | 5.30 | 4.13 | 5.29 |
| 1.95 | 150 | 5.10 | 3.96 | 5.16 |

As shown in Table 1, the frequency is independent of supply voltage $V_{CC}$ because the charging current $V_{BG}$ and the reference voltage $V_{BG}$ do not change with supply voltage $V_{CC}$. There is however, significant variation over temperature and process. Trim must be used to re-center the frequency over process, in the absence of which the frequency is as high as 7.6 MHz at the strong corner with supply being 1.65 V at cold temperatures. These variations are mainly due to variations in capacitor and resistor values. The resistor variation leads to variation in the constant current $V_{BG}$ that charges the capacitors, e.g. C3, C4, and causes frequency variation at the output. The value of the capacitors may change with process, which also causes frequency variation. In this example, in the absence of trim the oscillator output frequency varies from 7.6 to 3.96 MHz while it is centered around 5.5 MHz, a variation of 3.6 MHz.

The frequency of relaxation oscillators used in monolithic designs depends on the resistors and capacitors used in their implementation. The output frequency therefore varies to the extent that the resistors and the capacitors vary over process and temperature, and due to changes in the supply voltage. Though the supply dependency may be overcome using techniques known in the arts, the variation over process persists unless external trim components are used. Due to these and other problems, methods and circuits for providing relaxation oscillators insensitive to variations in process, supply voltage, or temperature changes would be useful and advantageous in the arts.

SUMMARY OF THE INVENTION

A time reference circuit insensitive to internal variations in resistance, capacitance, and temperature, is provided. In general, the circuit is arranged so that variations in electrical properties of the components tend to cancel one another. In a preferred embodiment, a circuit of the invention uses a charging capacitor connected to a current source for charging. The charging current source has an inherent resistance variation. A reference voltage circuit is used for generating a reference voltage that varies in relationship to the resistance variation of the charging current source, thus canceling the resistance variation. The reference voltage circuit also has a gate capacitance variation which cancels the variation of the MOS capacitance of the circuit. The reference voltage circuit and charging current circuit are also preferably configured to have the same inherent temperature variation so that potential errors due to temperature tend to cancel one another.

In carrying out the principles of the present invention, in accordance with preferred embodiments thereof, preferred embodiments of the invention provide a relaxation oscillator circuit including a reference voltage circuit configured to maintain a reference voltage in proportion to actual circuit resistance values.

According to an aspect of the invention, a relaxation oscillator circuit embodiment of the invention includes a charging current generator for generating a charging current from a voltage. A reference voltage circuit is provided for generating a reference voltage inversely proportional to the resistance of the charging current generator. Examples of preferred embodiments of the invention also include an oscillation generator for generating an oscillating output voltage from the charging current. The oscillation generator of the invention further includes one or more capacitors for charging by charging current, and a circuit configured to compare the voltage across each capacitor to the reference voltage. A switch circuit is controlled by the comparison circuit in order to regulate charging and discharging the capacitors.

According to another aspect of the invention, a preferred embodiment of a relaxation oscillator circuit includes a charging current generator configured to dynamically compensate for variations in temperature.

According to another aspect of the invention, a monolithic relaxation oscillator circuit includes a charging current generator configured for dynamically compensating the charging current for variations in temperature. A reference voltage circuit is included for generating a reference voltage inversely proportional to the resistance of the charging current generator. An oscillation generator is placed for receiving the charging current and generating an oscillating output voltage. The oscillation generator includes one or more capacitors for charging by the charging current, and a comparing circuit for comparing the voltage across each capacitor to the reference voltage. A switching circuit controlled by the comparing circuit is operably coupled for charging and discharging each capacitor.

According to yet another aspect of the invention, a relaxation oscillator circuit according to an example of a preferred embodiment of the invention has a charging current generator configured to use a current proportional to absolute temperature for charging one or more capacitors.

According to another aspect of the invention, a relaxation oscillator circuit embodiment of the invention includes a reference voltage circuit having dual current mirrors for balancing the reference voltage proportional to the resistance of the charging current generator.

The invention has advantages including but not limited to providing robust relaxation oscillators with limited frequency variation due to their relative insensitivity to supply, process, or temperature effects. Additional advantages include the elimination of the need for external trimming. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1A:
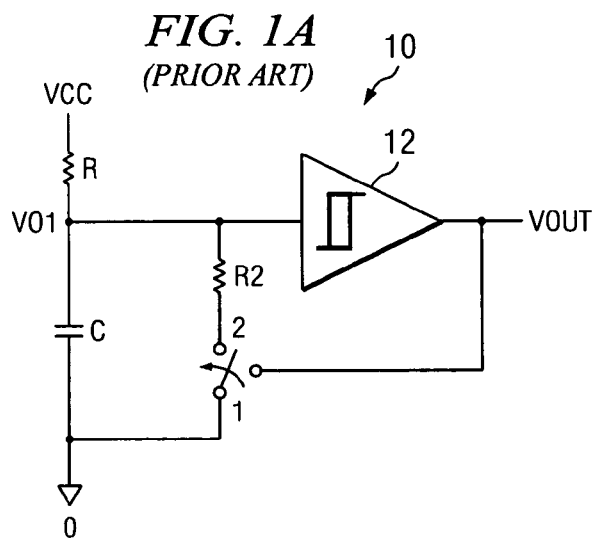
FIG. 1A (prior art) is a simplified conceptual schematic diagram representative of R-C relaxation oscillator circuits known in the arts.
Figure 1B:
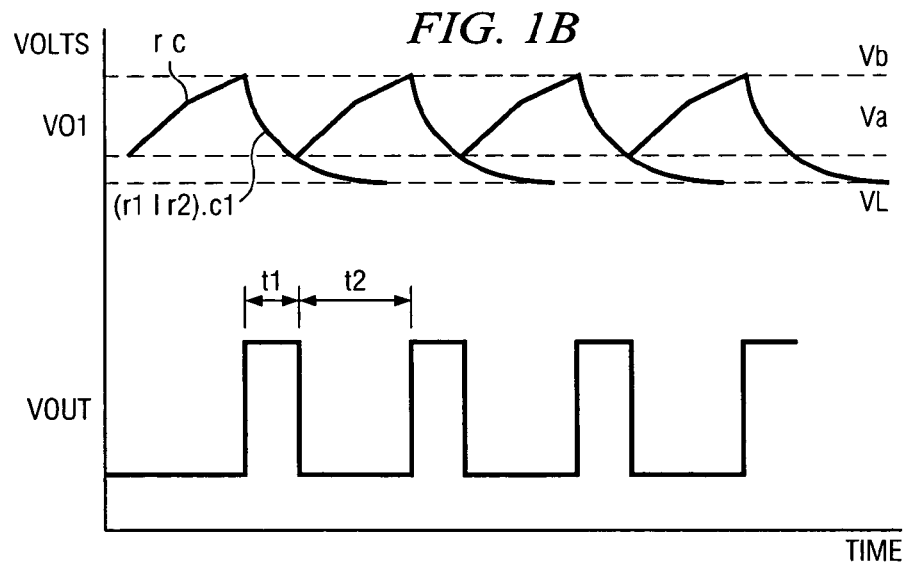
FIG. 1B is a representation of an example of the output of an R-C relaxation oscillator.
Figure 2A:
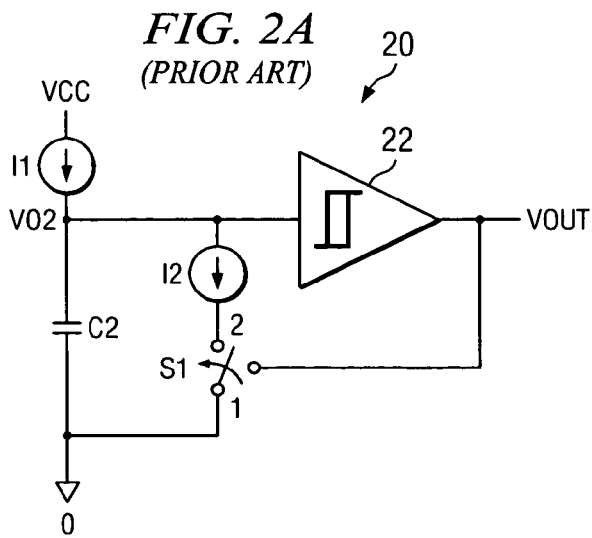
FIG. 2A (prior art) is a simplified conceptual schematic diagram representative of a constant-current relaxation oscillator circuit known in the arts.
Figure 2B:
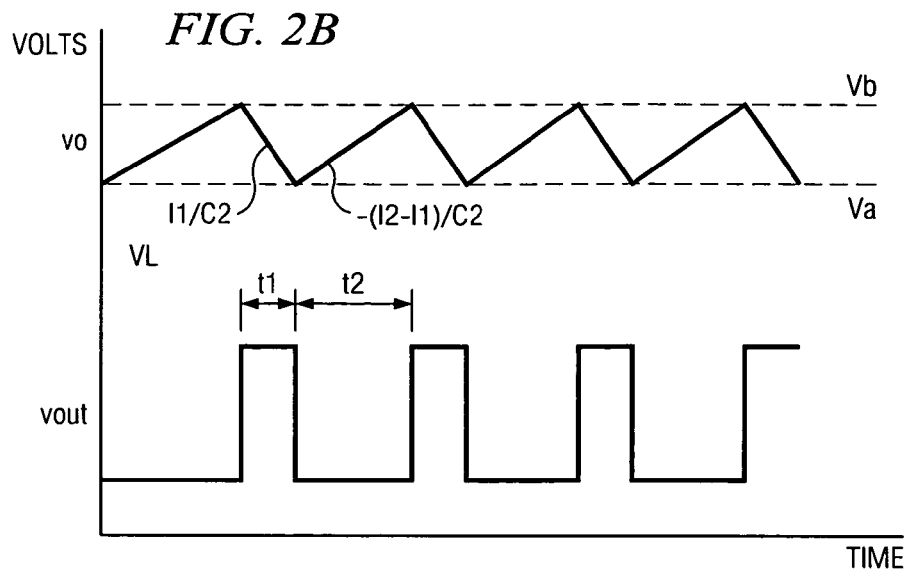
FIG. 2B is a representation of an example of the output of a constant-current relaxation oscillator.
Figure 3:
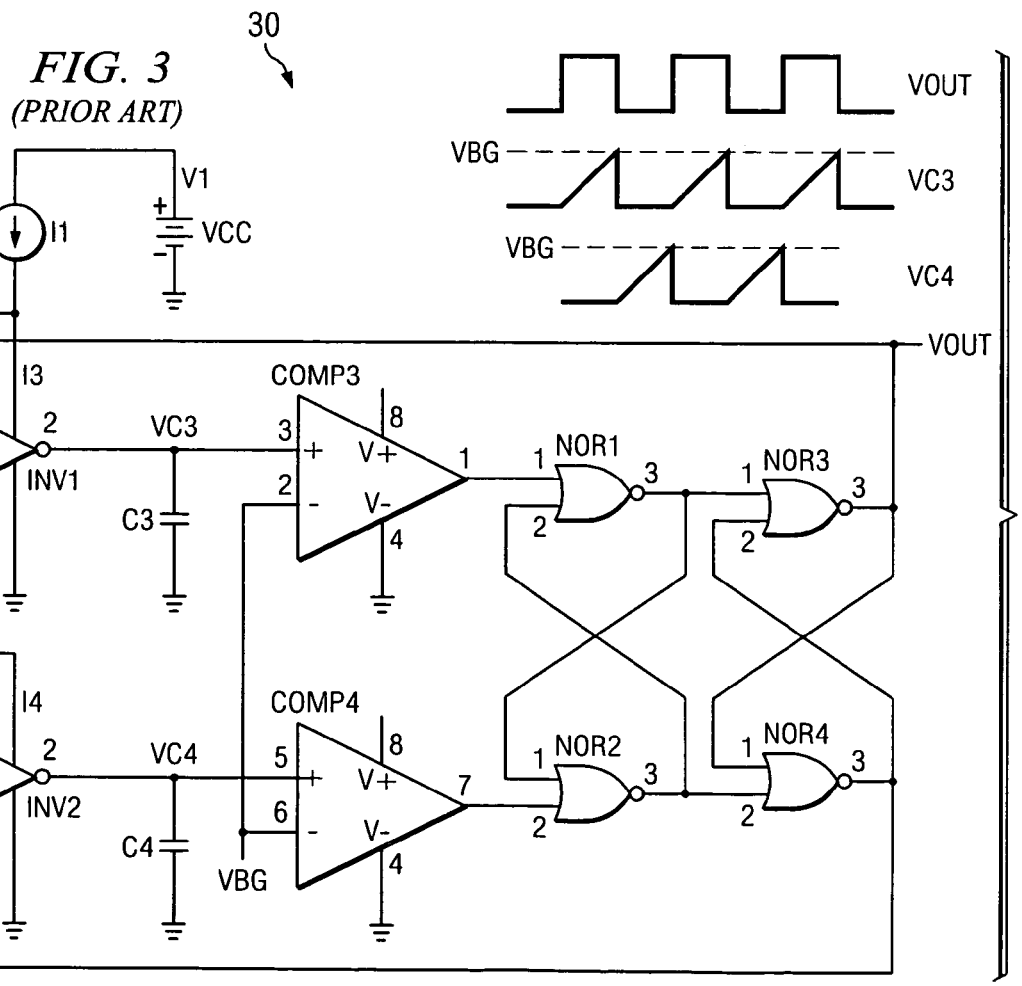
FIG. 3 (prior art) is a simplified schematic conceptual diagram representative of a band-gap voltage referenced relaxation oscillator circuit known in the arts.
Figure 4:
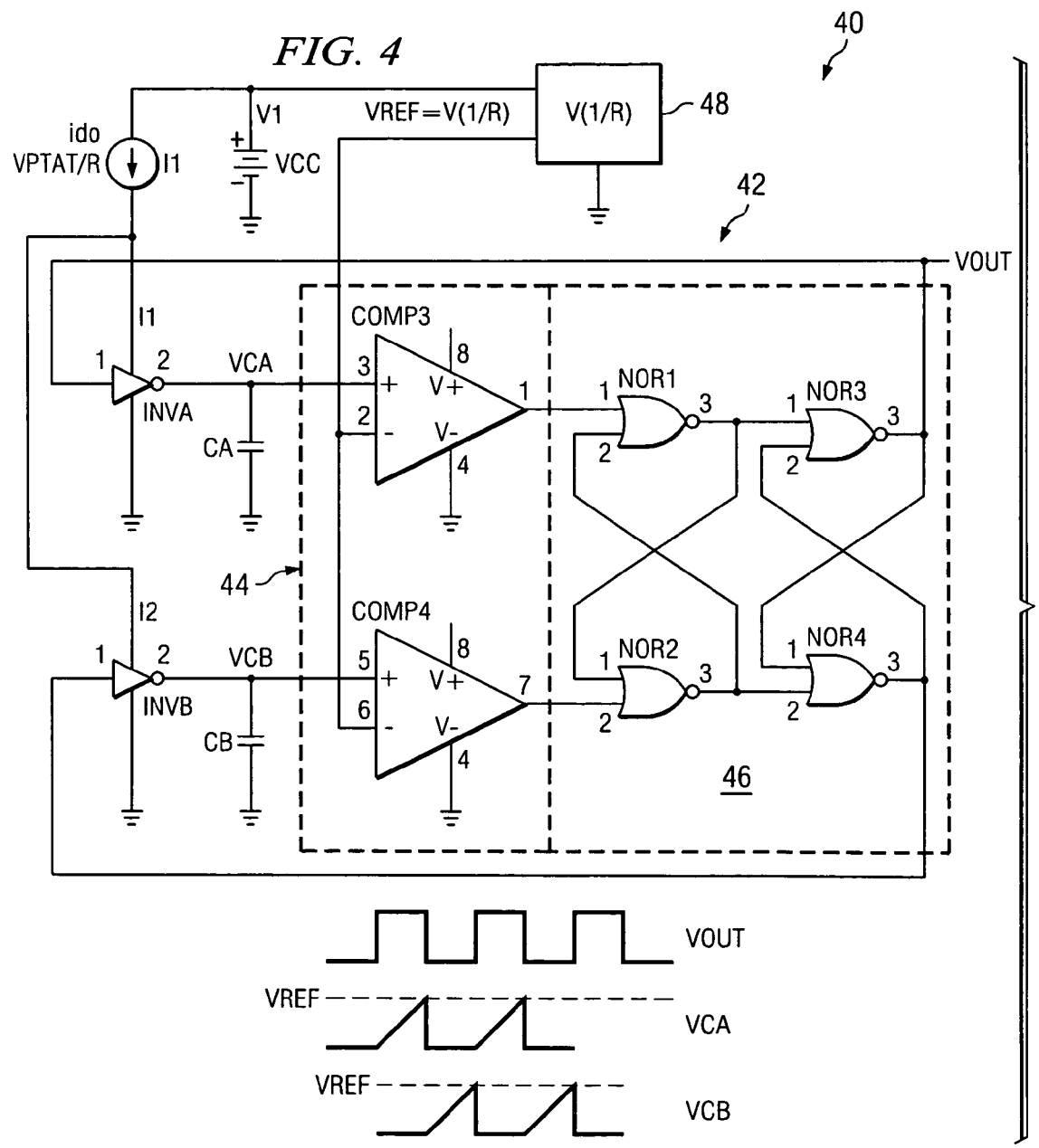
FIG. 4 is a simplified schematic diagram of an example of a preferred embodiment of a relaxation oscillator according to the invention.

The invention uses circuit techniques to limit relaxation oscillator output frequency variation to the absolute variation of hole mobility $U_p$ in the process. Preferably, temperature variation of $U_p$ is also cancelled out to a good extent. The methods and circuits described provide oscillator output with a tightly controlled frequency distribution. Referring primarily to FIG. 4, topology representative of a preferred embodiment of a relaxation oscillator circuit 10 according to the invention is shown. Those skilled in the arts will recognize that the present invention is not limited to a specific frequency range nor to a specific selection of transistors, logic elements, or other circuit components. The examples shown and described are representative of a particular preferred embodiment of the invention and it is anticipated that various circuitry may also be used to implement the invention.

In the preferred embodiment of the invention shown in FIG. 4, the relaxation oscillator 40 is implemented on a single monolithic integrated circuit. The precision relaxation oscillator 40 includes an oscillation generator 42. Typically the oscillation generator 42 has two capacitors CA, CB, each coupled between an inverter INVA, INVB, and a comparator circuit 44. The oscillation generator 42 operates by allowing one capacitor, for example CA, to charge while allowing the other capacitor, in this example CB, to discharge. The discharge path for each capacitor CA, CB, is coupled to the input of a respective comparator COMPA, COMPB of the comparator circuit 44. A switch circuit 46, in this example implemented using a series of NOR gates, is configured to alternately set and reset as the capacitors CA, CB alternately charge and discharge, thus producing a clock output VOUT. Although a constant-current relaxation oscillator topology 40 is shown and described in this example, it should be recognized that alternative topologies may also be used without departure from the invention. A reference voltage circuit 48 provides a reference voltage $V_{REF}$ to the comparator circuit 44 for comparison to the voltage across each capacitor CA, CB. Various topologies of reference voltage circuits 48 may also be used so long as the reference voltage $V_{REF}$ generator functions as described herein.

$$I = Vbg/R = C.dV/dt \qquad (eq\ 14)$$

$$t1 = t2 = C.VREF/I \qquad (eq\ 15)$$

$$f = 1/(t1+t2) = Vbg/2.C.R.VREF \qquad (eq\ 16)$$

Figure 5:
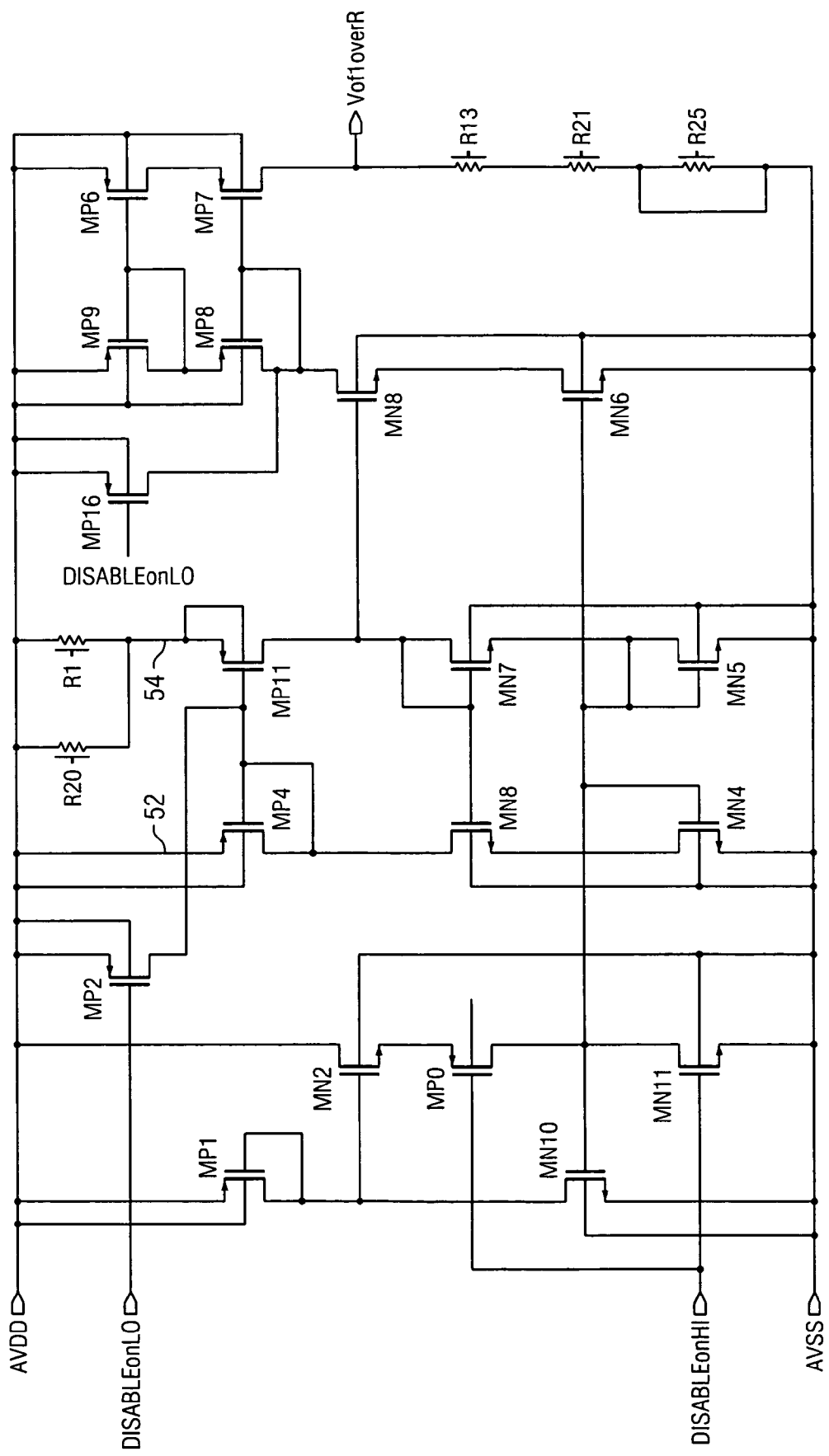
FIG. 5 is a simplified schematic diagram of an example of a preferred embodiment of a reference voltage generator for use in the preferred embodiment of the invention exemplified in FIG. 4.

From equations 13 and 16, it can be seen that the frequency in the constant-current oscillator depends on the R-C product of the on-chip components. The variation from the resistor R is cancelled out according to the invention if the voltage reference $V_{REF}$ for the comparator is made a function of the resistor value R. Specifically, if $V_{REF}$ (or $V_b$-$V_a$ in equation 13) varies as 1/R, it will cancel out the variation of the resistor R. An example of the circuit topology of a reference voltage generator 48 used in the preferred embodiment of the invention illustrated in FIG. 4, is shown in more detail in FIG. 5. In this voltage reference generator circuit 48, Resistors R1 and R20 are the same kind as the resistance R used to generate the current $I_{BG}$ from the band-gap voltage $V_{BG}$, and hence have the same variation. Hereinafter this parallel combination (R1, R20) is denominated $R_p$. Current mirrors MP4, MP11, MN4, MN5, MN7 and MN8 force the currents in the two paths 52, 54, to be equal. MP4 and MP11 are sized differently, with MP11 preferably being the larger. In the presently preferred embodiment, S11 (W11/L11) is 5/3 times larger than S4. The current $I_P$ in either MP11 or MP4 is equal to ($VGS_{mp4}$-$VGS_{mp11}$)/($R_P$). This current $I_P$ is then mirrored by transistors MP8, MP7, MP9, and MP5 and is used to generate the reference voltage $V_{REF}$ with a $1/R_P$ dependency. The $1/R_P$ dependency occurs since the resistor $R_{REF}$ (R13+R21) is of the same kind as $R_P$ and has the same process variation as $R_p$. It can be shown that the current $I_P$ has a $1/R_P^2$ dependency, as described by Equations 17-21. Typically, transistors MP0, MP1, MN2, MN10 and MN11 are used for start-up purposes and are not essential to the invention.

$$Rp = R1 \| R20 \qquad (eq\ 17)$$

$$Ip = (VGSmp4 - VGSmp11)/Rp \qquad (eq\ 18)$$

$$Ip = \{Sqrt[2I/(Up.Cox.S4)] - Sqrt[2I/(Up.Cox.S11)]\}/Rp \qquad (eq\ 19)$$

$$Ip = \{2/(Up.Cox.S4.(Rp^2))\}\{[1 - Sqrt(S4/S11)]^2\} \qquad (eq\ 20)$$

$$Vref = Ip.Rref = \{2Rref/(Up.Cox.S4.(Rp^2))\}\{[1 - Sqrt(S4/S11)]^2\} \qquad (eq\ 21)$$

One potential source of frequency variation when using $V_{REF}$ as a reference is that it depends on the hole mobility $U_p$ in the materials used, which varies over temperature and process. In order to cancel out the temperature variation of $U_p$, a current Proportional To Absolute Temperature (PTAT) is preferably used for charging the capacitors CA, CB shown in the example of FIG. 4. By adjusting the sizes of MP11 and MP4, their size ratio may be fixed empirically such that the temperature constant (TC) of $V_{REF}$ is approximately the same as the $I_{PTAT}$ used as the current reference for the oscillator design. The $1/R_P$ dependency of $V_{REF}$ over resistor variation and temperature variation are further illustrated in FIG. 6 and FIG. 7.

Figure 6:
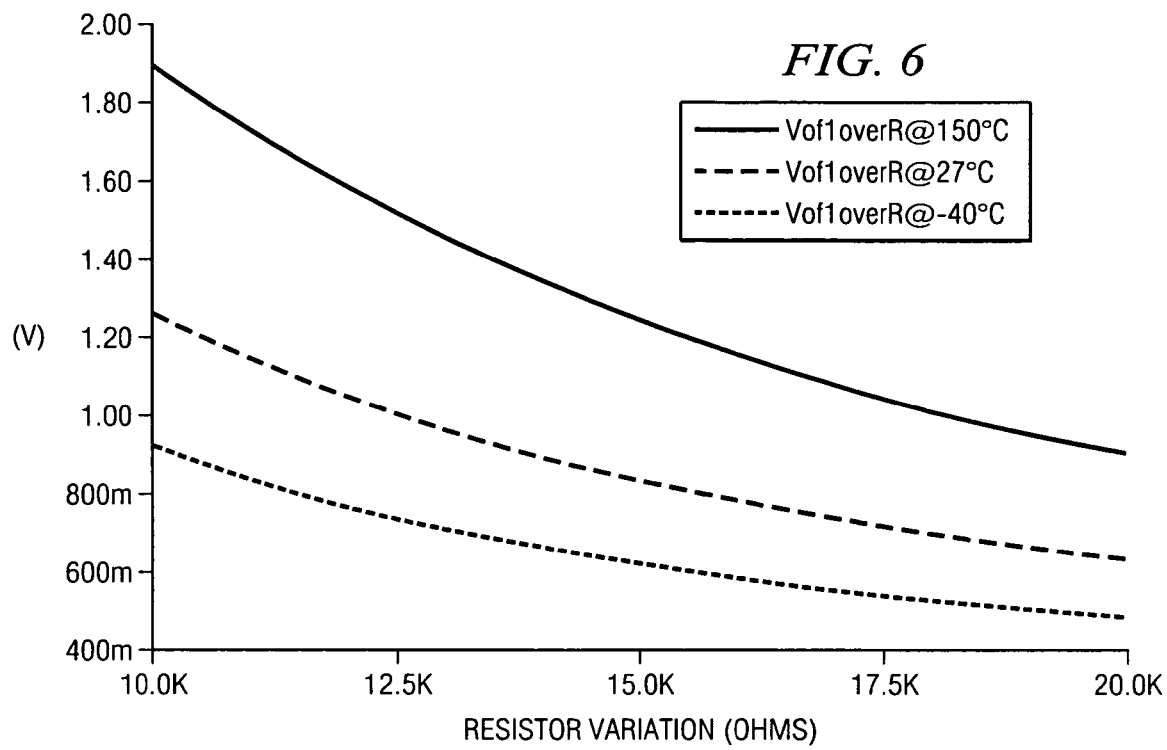
FIG. 6 is a graphical representation of the reference voltage over various temperatures and resistor values in the exemplary embodiment of the invention depicted in FIG. 4.

The $1/R_P$ dependency of $V_{REF}$ over resistor variation is illustrated in the example of FIG. 6. The variation of the reference voltage VREF is shown for traces indicating three temperature levels of −40 degrees, 27 degrees, and 150 degrees Celsius over a range of resistances. It can be seen that as the resistor value depicted along the x-axis is changes by a factor of two, the reference voltage correspondingly changes by a factor of approximately two.

Figure 7:
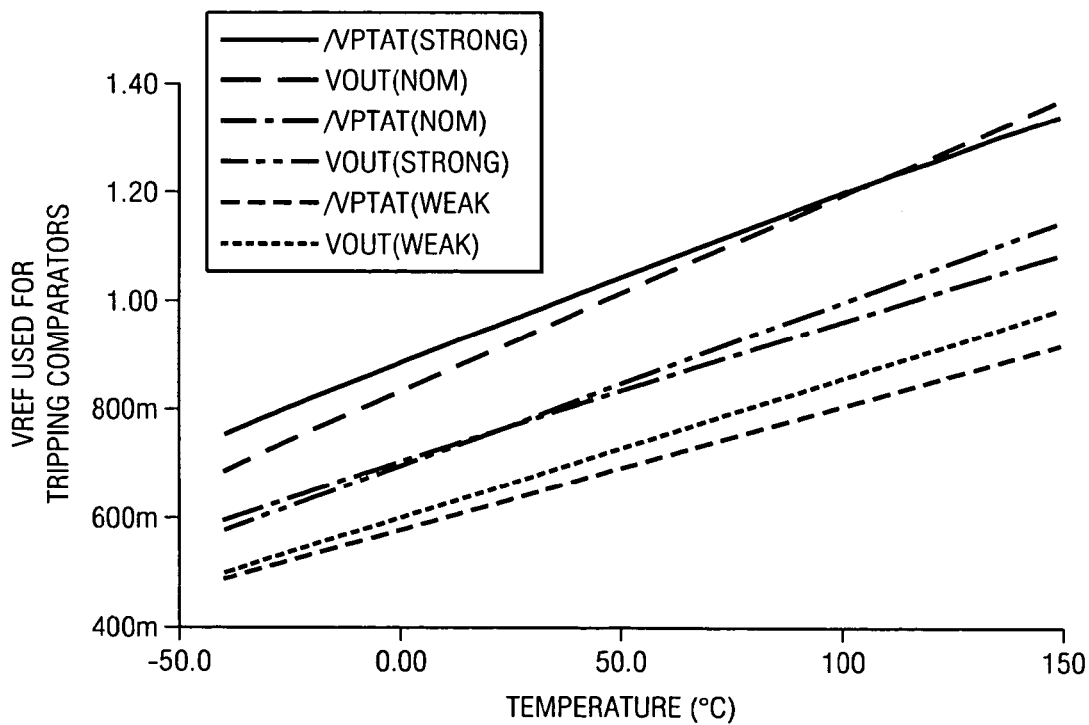
FIG. 7 is a graphical representation of an example of compensation for temperature variation in the exemplary embodiment of the invention depicted in FIG. 4.

FIG. 7 provides a graphic representation of the reference voltage VREF and VPTAT over a range of temperatures from −50 degrees to 150 degrees Celsius. It can be seen that the reference voltage $V_{REF}$ roughly matches voltage (VPTAT) generated by placing a resistor across the reference current $I_{PTAT}$.

Referring again to FIG. 4 and the $1/R_P$ referenced oscillator design, the voltage $V_{REF}$ that has a $1/R_P$ dependency is used to set the reference voltage VREF of the comparators COMPA, COMPB. An $I_{PTAT}$ current is used to charge the capacitors CA, CB, and this current itself has a $1/R_P$ dependency since an on-chip resistor R is used to generate it from the band-gap voltage $V_{BG}$. It should be noted with reference to Equation 21 that the reference voltage $V_{REF}$ generated from the 1/R block also depends on Cox. If the timing capacitor in the oscillator design is also from the gate capacitance of a PMOS device, the variation in capacitor values can be cancelled out with the variation of VREF on Cox. This way both the R and C variation can be cancelled out and the frequency depends only upon the hole mobility $U_p$ in the process. The temperature variation in the oscillator frequency, or a general time reference constructed out of monolithic components, can thus be made process insensitive except for a dependence on mobility. In order to cancel out the temperature variation of mobility, a temperature dependent current is preferably used as the charging current such that its temperature coefficient is the same as that of the mobility of holes, or electrons as the case may be. An approximation of such a temperature dependent current is a PTAT current. Using the $I_{PTAT}$ current for charging the capacitors cancels out the temperature variation of $U_p$. This makes the frequency of the oscillator remain constant even as process, temperature and supply variations occur except for variations in absolute value of $U_p$. The cancellation process is more evident in the following equations where Equation 21 and Equation 16 are used to derive the frequency of the oscillator.

$$Sc = W \times L \text{ for the capacitor} \quad \text{(eq 22)}$$
$C = Sc.Cox$ if PMOS gate capacitance
is used to set the timing capacitor
substituting eq-21 in eq-16 and VPTAT for
Vbg(since current is now PTAT)
$f = \{VPTAT.Up.Cox.S4.(Rp^2)/(4.Sc.Cox.R.Rref)\}$
$\{[1 - Sqrt(S4/S11)]^2\}$ Since R, Rp and Rref have same variation, they cancel out (eq 23)
$f = \{VPTAT.Up.S4/(4.Sc)\}\{[1 - Sqrt(S4/S11)]^2\}$ From Equation 23, it can be seen that the only process variation that effects the frequency is variation in $U_p$. The reduced frequency variation of the invention is further evident from the data in Table 2, which has the same corner variations as in Table 1.

TABLE 2

| Supply Voltage | TEMP | Trim = 01 NOMINAL Frequency (MHz) | Trim = 01 WEAK frequency (MHz) | Trim = 11 STRONG Frequency (MHz) |
|---|---|---|---|---|
| 1.65 | −40 | 5.22 | 4.90 | 5.56 |
| 1.65 | 27 | 5.08 | 4.84 | 5.32 |
| 1.65 | 150 | 4.87 | 4.82 | 4.95 |
| 1.80 | −40 | 5.25 | 4.93 | 5.60 |
| 1.80 | 27 | 5.11 | 4.88 | 5.36 |
| 1.80 | 150 | 4.90 | 4.85 | 5.00 |
| 1.95 | −40 | 5.28 | 4.95 | 5.63 |
| 1.95 | 27 | 5.14 | 4.90 | 5.39 |
| 1.95 | 150 | 4.93 | 4.88 | 5.00 |

It may be seem by comparison of Table 2 with Table 1, that the frequency variation, previously 3.6 MHz in the absence of trim, has been reduced to 0.8 MHz with the maximum at 5.63 MHz and minimum at 4.82 MHz. The variation over temperature is also reduced considerably.

To summarize and reiterate the principles and practice of the invention, a process insensitive time reference can be created by using a charging capacitor and using a current to charge it. By creating a voltage reference that varies with resistor variation as 1/R, the variation of the charging current due to resistance variations can be compensated. In addition, the described voltage reference depends on the gate oxide of MOS devices (varies as 1/Cox), and this can be used to balance out the variation of the charging capacitor itself when the reference circuit is constructed using MOS gate capacitance. This voltage reference however, has a temperature variation as well. In order to cancel the variation due to temperature, the charging current is made to vary over temperature more or less as (1/Up) varies over temperature. This variation is approximated to a PTAT current variation in the oscillator circuit that is described here in detail. Those skilled in the arts will appreciate that the invention shown and described in the exemplary embodiment may be used in various other applications as well. Using the above techniques, it is possible to create accurate periodic waveforms as well as constant pulses of fixed duration that may be used for digital filtering applications, for example. The equations below summarize the cancellation techniques and provide an equation for the time reference dT.

$$dT = C.dv/i \quad \text{(eq 24)}$$
$i = \text{function}(1/R)$
$dv = \text{function}(1/R.Cox)$
$dT = 1/f = \{(4.Sc.Cox.R.Rref)/(VPTAT.Up.Cox.S4.(Rp^2))\}.$
$\{1/[1 - Sqrt(S4/S11)]^2\}$ It will be understood by those skilled in the arts that when a selected circuit parameter is known, such as for example, a frequency desired for a particular application, the additional attributes of the circuit described by equation 24 may be chosen based on available materials, related circuitry, or other factors.

The methods and devices of the invention provide advantages including but not limited to, in a preferred embodiment, providing improved relaxation oscillator frequency performance and the elimination of the need for external trimming. The invention provides superior time reference circuits and methods for their implementation. While the invention has been described with reference to certain illustrative embodiments, the methods and circuits described are not intended to be construed in a limiting sense. Various modifications and combinations of the illustrative embodiments as well as other advantages and embodiments of the invention will be apparent to persons skilled in the art upon reference to the drawings, description, and claims.

We claim:

1. A time reference circuit insensitive to internal variations in resistance, capacitance, and temperature, comprising:
   an MOS charging capacitor;
   a regulated charging current source switchably coupled to the capacitor, the charging current source having an inherent (1/R) resistance variation and having a current proportional to absolute temperature;
   a reference voltage circuit for generating a reference voltage that varies as 1/R wherein the resistance variation of the charging current source is compensated for, the reference voltage circuit also having an inherent MOS gate capacitance variation wherein the MOS transistor in the reference voltage circuit substantially compensates for the variation of the MOS charging capacitor; and
   wherein the reference voltage circuit has an inherent temperature variation, and wherein the charging current source inherently varies in relationship to the temperature variation of the reference voltage circuit, thereby compensating for the temperature variation.

2. A time reference circuit according to claim 1 described by:

$$dT=\{(4*Sc*Cox*R*Rref)/(VPTAT*Up*Cox*S4*(Rp^2))\}*\{1/[1-\text{Sqrt}(S4/S11)^2\}$$

where
   T=time;
   Sc*Cox=Charging capacitor value given by the area of the charging cap (Sc) multiplied by gate capacitance per unit area (Cox);
   R=resistance across which a voltage is imposed to create the charging current;
   Rp=resistance used in the voltage reference circuit to generate a current (Iref) that varies as $(1/Rp)^2$;
   Rref=resistance through which the current Iref sets up the reference voltage Vref;
   wherein R, Rp and Rref are all the same type of monolithic resistors such that the process variation in these cancels out;
   VPTAT=voltage proportional to absolute temperature;
   Up=hole mobility of the voltage generator circuit material;
   S4/S11=the relative ratio of switches in the reference voltage generator circuit.

3. A relaxation oscillator circuit comprising:
   a charging current generator having a resistance for generating a charging input current from a proportional to absolute temperature voltage making the charging current proportional to absolute temperature;
   a reference voltage circuit for generating a reference voltage;
   an oscillation generator for receiving the charging current and generating an oscillating output voltage, the oscillation generator further comprising:
   one or more MOS capacitors for charging by the charging current;
      a comparator circuit configured to compare the voltage across each capacitor to the reference voltage;
      a switch circuit controlled by the comparator circuit and coupled to the one or more capacitor for charging and discharging the one or more capacitor;
   wherein an untrimmed reference voltage circuit inherently maintains the reference voltage inversely proportional to the charging current generator resistance and proportional to temperature variation and inherent MOS capacitance.

4. A relaxation oscillator circuit according to claim 3 implemented on a single integrated circuit.

5. A relaxation oscillator circuit according to claim 4 further comprising a charging current generator configured for dynamically compensating the charging current for variations in temperature.

6. A monolithic relaxation oscillator circuit with temperature compensation comprising:
   a charging current generator having a resistance for generating a charging current from a voltage, the charging current generator configured generating a, charging current proportional to temperature;
   a reference voltage circuit for generating a reference voltage proportional to temperature;
   an oscillation generator for receiving the charging current and generating an oscillating output voltage, the oscillation generator further comprising:
   one or more MOS capacitors for charging by the charging current;
      a comparing circuit configured to compare the voltage across each of the one or more capacitors to the reference voltage;
      a switch circuit controlled by the comparing circuit and coupled to the one or more MOS capacitors for charging and discharging each of the one or more capacitors;
   wherein an untrimmed reference voltage circuit inherently maintains the reference voltage inversely proportional to the charging current generator resistance and proportional to temperature variation and MOS capacitance.

7. A relaxation oscillator circuit according to claim 6 wherein the charging current generator is configured to use a current proportional to absolute temperature for charging the one or more capacitors.

8. A relaxation oscillator circuit according to claim 6 wherein the reference voltage circuit further comprises dual current mirrors for maintaining the reference voltage proportional to charging current generator resistance.

9. A relaxation oscillator circuit according to claim 6 wherein the comparison circuit further comprises dual comparators and dual capacitors.

10. A relaxation oscillator circuit comprising:
   means for switching current from an oscillator current source having an inherent 1/R resistance variation and having a current proportional to absolute temperature to obtain a periodic waveform output voltage;
   means for generating a reference voltage inversely proportional to the resistance of the oscillator current source wherein the resistance variation is compensated for;
   means for comparing the output voltage to the reference voltage; and
   untrimmed temperature compensating means for adjusting the oscillator current according to changes in temperature and inherent MOS capacitance, thereby maintaining an output having a substantially fixed frequency.

* * * * *